United States Patent [19]
Le Pailleur et al.

[11] Patent Number: 5,856,800
[45] Date of Patent: Jan. 5, 1999

[54] ANALOG-TO-DIGITAL CONVERTER HAVING A HIGH SAMPLING FREQUENCY

[75] Inventors: Laurent Le Pailleur, Caen, France; Rudy J. Van De Plassche, Eindhoven, Netherlands

[73] Assignee: U.S. Philips Corporation, NY, N.Y.

[21] Appl. No.: 824,622

[22] Filed: Mar. 27, 1997

[30] Foreign Application Priority Data

Mar. 29, 1996 [FR] France ................................. 9604001

[51] Int. Cl.$^6$ ................................................ H03M 1/36
[52] U.S. Cl. ........................................... 341/159; 341/155
[58] Field of Search .................................. 341/159, 160, 341/155, 158, 165

[56] References Cited

U.S. PATENT DOCUMENTS

| | | | |
|---|---|---|---|
| 4,211,999 | 7/1980 | Clark et al. | 341/160 |
| 4,912,469 | 3/1990 | Van De Grift et al. | 341/159 |
| 5,051,746 | 9/1991 | Van De Grift et al. | 341/159 |

OTHER PUBLICATIONS

"An 8–Bit Video ADC Incorporating Folding and Interpolation Techniques" By Messrs. Rob E. Van De Grift, Ivo W.J.M. Rutten And Martien Van Der Veen, Publsihed In The IEEE Journal Of Solid–State Circuits, vol. SC–22, No. 6, of Dec. 1987.

"An 8–bit 100MHz Full–Nyquist Analog to Digital Converter" Van de plassche et al. IEEE Journal of Solid–State circuits vol. 23, No. 6, Dec. 1988.

*Primary Examiner*—Brian K. Young
*Assistant Examiner*—Peguy JeanPierre
*Attorney, Agent, or Firm*—Steven R. Biren

[57] ABSTRACT

A high frequency analog-to-digital converter in which a memory stage receives the result of a series of comparisons of an analog input voltage Vin with a set of reference voltages Vi (where i=0 to Q). Each memory cell Mi (where i=0 to Q) comprises N memory flip-flops L0, L1, . . . LN–1, a multiplexer Mx, and a logic or control module CL. All of the data inputs of the memory flip-flops L0, L1, . . . LN–1 are connected together to the data input of the memory cell. The jth memory flip-flop (where j=0 to N–1) receives at its clock input the clock signal which has been delayed by means of a delay cell having a delay of j.T/N, where T is the period of the clock signal. The data outputs of the N memory flip-flops are connected to the N data inputs of the multiplexer, whose P control inputs receive the P outputs of the control module so that the multiplexer supplies the output signal of the jth memory flip-flop Lj at its output during each (j+1)th fraction of the period T/N. The structure of the memory cells makes it possible to minimize the influence of metastability phenomena, which may give rise to errors during latching of the analog output signals of the comparators.

21 Claims, 8 Drawing Sheets

ANALOG-TO-DIGITAL CONVERTER HAVING A HIGH SAMPLING FREQUENCY

BACKGROUND OF THE INVENTION

1. Field of the Invention

The present invention relates to an analog-to-digital converter receiving an analog input voltage to be converted into a digital output signal, comprising:

a ladder network of resistors arranged in series between a positive supply terminal and a negative supply terminal, which resistors produce a plurality of voltages referred to as reference voltages on the nodes between them, a stage of comparators, each comparing the analog input voltage with one of the reference voltages, a memory stage comprising memory elements referred to as memory cells, each memory cell having a data input, a data output and a clock input, and receiving the output signal of a comparator at its data input, all the memory cells forming the memory stage receiving a similar signal, referred to as the clock signal, at their clock inputs, and a binary encoder which receives the outputs of the memory stage at its input and supplies the digital output signal of the converter.

2. Description of Related Art

Such an analog-to-digital converter, generally referred to as a parallel converter, is described in the article "An 8-bit Video ADC Incorporating Folding and Interpolation Techniques" by Messrs. Rob E. Van de Grift, Ivo W. J. M. Rutten and Martien Van der Veen, published in the IEEE Journal of Solid-State Circuits, Vol. SC-22, No. 6, of December 1987.

The memory cells used in this converter exhibit metastability problems in fields of use where the sampling frequency, which is defined as the number of times per second that a digital representation of the analog input voltage is latched, is high, i.e. when it approximates a limit frequency which is intrinsically defined by the fabrication process used for the implementation of the circuit. Indeed, the transition from analog to digital takes place when the states of the comparator outputs, which are analog signals, are loaded into the memory cells, whose digital outputs are switched at the rate imposed by the clock signal. The statistical theory of metastability reveals that the probability that an error occurs during the storage of an analog signal which exhibits a transient state increases strongly as the clock frequency, which controls the memory cell in which said analog signal is to be loaded, increases. As a matter of fact, it is found that if Fl is the intrinsic limit frequency imposed by the fabrication process, the error probability is of the order of exp (1−Fl/F). In the case of the analog-to-digital converter described in the article "An 8-bit Video ADC Incorporating Folding and Interpolation Techniques" the frequency of the signal which clocks the memory cells is equal to the sampling frequency Fe. The probability that an error due to metastability phenomena occurs during latching of the comparator output states is then of the order of exp (1−Fl/Fe).

SUMMARY OF THE INVENTION

It is an object of the present invention to minimize the influence of these metastability phenomena, particularly at a high sampling frequency, by proposing an analog-to-digital converter whose clock signal for the memory cells, for a given sampling frequency, is equal to a fraction of the sampling frequency.

To this end, an analog-to-digital converter in accordance with the invention is characterized in that each memory cell comprises N flip-flops, referred to as memory flip-flops, a multiplexer, and a logic module, referred to as the control module, each memory flip-flop having a data input, a data output and a clock input, the multiplexer having N data inputs, one output forming the output of the memory cell, and P control inputs, N and P being related in such a manner that $N=2^P$, the control module having N inputs and P outputs, all the data inputs of the memory flip-flops being connected together to the data input of the memory cell, the jth memory flip-flop (where j=0 to N−1) receiving at its clock input the clock signal delayed by j.T/N, where T is the period of the clock signal, the data outputs of the N memory flip-flops being connected to the N data inputs of the multiplexer, whose P control inputs are connected to the P outputs of the control module, which control module has each of the N inputs connected to one of the clock inputs of the N flip-flops and has its P outputs arranged in such a manner that the multiplexer supplies the output signal of the jth memory flip-flop at its output during each (j+1)th fraction of a period of the length T/N.

In such an analog-to-digital converter N digital representations of the analog input voltage are latched during one and the same period of the clock signal. The frequency of the clock signal which clocks each of the memory flip-flops in the memory cells of a such a converter is consequently N times as small as the sampling frequency, which considerably reduces the probability that an error occurs owing to metastability phenomena. As a matter of fact, this probability is then of the order of exp(1−N.Fl/Fe), where Fe is the sampling frequency.

An embodiment of the invention provides an analog-to-digital converter as described hereinbefore, which is characterized in that the memory flip-flops in the memory cells of the memory stage are D flip-flops.

Apart from their memory function, the D flip-flops provide input signal amplification. It may be advantageous to arrange a plurality of these flip-flops in series within one memory flip-flop in order to increase the gain provided by this memory flip-flop.

Therefore, an advantageous embodiment of the invention provides an analog-to-digital converter, which is characterized in that the memory flip-flops in the memory cells of the memory stage are flip-flops of the master-slave type.

A special embodiment of the invention provides an analog-to-digital converter as defined above, which is characterized in that each memory cell comprises two flip-flops, referred to as memory flip-flops, and a multiplexer, each memory flip-flop having a data input, a data output and a clock input, the multiplexer having two data inputs and one control input, the data inputs of the two memory flip-flops being connected to one another and forming the data input of the memory cell, one of the memory flip-flops receiving the clock signal at its clock input and the other one receiving the inverse of said signal at its clock input, the data outputs of the two memory flip-flops being connected to the data inputs of the multiplexer, whose control input receives the clock signal and whose output forms the output of the memory cell.

Such an analog-to-digital converter forms a special variant embodying the invention, in which one memory cell comprises two memory flip-flops. This merely requires a shift of the clock signal by T/2, which is achieved by inverting this signal. In such an analog-to-digital converter the probability that an error due to metastability phenomena occurs during the latching of the comparator output states is then of the order of exp (1–2Fl/Fe).

The metastability phenomena described hereinbefore can have undesirable effects in all kinds of uses where a digital representation of an analog voltage is to be obtained by means of memory cells which are clocked by a clock signal of high frequency. An analog-to-digital converter using folding and interpolation techniques, as described in the afore-mentioned article "An 8-bit Video ADC Incorporating Folding and Interpolation Techniques", can therefore exhibit such undesirable effects at a high sampling frequency, as outlined above.

The invention therefore also relates to an analog-to-digital converter receiving an analog input voltage to be converted into a digital output signal, comprising:

a ladder network of resistors arranged in series between a positive supply terminal and a negative supply terminal, which resistors produce a plurality of voltages referred to as reference voltages on the nodes between them, stages referred to as folding stages, each comprising an array of comparators adapted to generate a signal referred to as folding signal, which signal varies as a quasi-sinusoidal function of the analog input voltage, and a signal which is the counterpart of this folding signal, a first and a second interpolation stage, the first one receiving the folding signals and the second one receiving their counterparts, each interpolation stage being made up of impedance elements, preferably resistors of equal value, arranged as a divider bridge in such a manner that the signals, referred to as sampling signals, generated across the elements of the first interpolation stage represent fractions of the folding signals, the signals generated by the second interpolation stage forming their counterparts, a cycle detector which receives the folding signals and their counterparts and supplies signals referred to as cycle pointer signals and signals forming the counterparts thereof, enabling to identify that one of the cycles of the sampling signals which is significant of the value of the analog input voltage, a first memory stage comprising memory elements referred to as memory cells, each memory cell having two data inputs, a data output and a clock input, and receiving at its data inputs a sampling signal and its counterpart, all the memory cells forming the first memory stage receiving a similar signal, referred to as the clock signal, at their clock inputs, a second memory stage comprising memory cells, each memory cell receiving at its data inputs a cycle pointer signal and its counterpart, all the memory cells forming the second memory stage receiving the clock signal at their clock inputs, a binary encoder which receives the outputs of the memory stages at its input and supplies the digital output signal of the converter, characterized in that the memory cells of the memory stages each comprise N flip-flops referred to as memory flip-flops, a multiplexer, and a logic module referred to as the control module, each memory flip-flop having a data input, a data output and a clock input, the multiplexer having N data inputs and P control inputs and one output forming the output of the memory cell, N and P being related in such a manner that $N=2^P$, the memory module having N inputs and P outputs, all the data inputs of the memory flip-flops being connected together to the output of the input comparator of the memory cell, the jth memory flip-flop (where j=0 to N−1) receiving at its clock input the clock signal delayed by j.T/N, where T is the period of the clock signal, the data outputs of the N memory flip-flops being connected to the N data inputs of the multiplexer, whose P control inputs are connected to the P outputs of the control module, each of the N inputs of the control module being connected to one of the clock inputs of the N memory flip-flops, and the P outputs of said control module being arranged in such a manner that the multiplexer supplies the output signal of the jth memory flip-flop at its output during each (j+1)th fraction of a period of the length T/N.

In such an analog-to-digital converter the zero condition of a sampling signal indicates equality of the analog input voltage with one of the reference voltages. The least significant bits of the digital output signal are thus determined by detection of the zero crossings of the sampling signals. The most significant bits are determined by means of cycle pointer signals, which make it possible to identify those sampling signal cycles in which the significant zero crossing takes place and hence to determine to which of the reference voltages the analog input voltage is equal during this zero crossing.

In such an analog-to-digital converter, as in the parallel converter, N digital representations of the analog input voltage are latched in the same period of the clock signal. The frequency of the clock signal which clocks each of the memory flip-flops which form part of the memory cells of such a converter, is therefore N times as small as the sampling frequency Fe, which reduces to exp (1N.Fl/Fe the probability that an error due to metastability phenomena occurs.

In an embodiment of the invention, an analog-to-digital converter using folding and interpolation techniques as described above, is characterized in that the memory flip-flops in the memory cells of the memory stage are D flip-flops.

As set forth for the parallel converter, it may be advantageous to arrange a plurality of D flip-flops in series within one memory flip-flop in order to increase the gain provided by this memory flip-flop.

In an advantageous embodiment of the invention, an analog-to-digital converter using folding and interpolation techniques is characterized in that the memory flip-flops in the memory cells of the memory stages are flip-flops of the master-slave type.

A special embodiment of the invention provides an analog-to-digital converter, which is characterized in that each memory cell of the memory stage comprises two flip-flops, referred to as memory flip-flops, and a multiplexer, each memory flip-flop having a data input, a data output and a clock input, the multiplexer having two data inputs and one control input, the data inputs of the two memory flip-flops being connected together to the output of the input comparator of the memory cell, one of the memory flip-flops receiving the clock signal at its clock input, and the other one receiving the inverse of this signal at its clock input, the data outputs of the two memory flip-flops being connected to the data inputs of the multiplexer, whose control input receives the clock signal and whose output forms the output of the memory cell.

Such an analog-to-digital converter forms a special variant embodying the invention. As a matter of fact, one memory cell comprises two memory flip-flops. This merely requires a shift of the clock signal by T/2, which is effected by inverting this signal. In such an analog-to-digital converter the probability that an error due to metastability phenomena occurs during latching of the comparator output states is then of the order of exp (1–2Fl/Fe).

Analog-to-digital converters are not the only circuits in which metastability phenomena can produce undesirable effects. Any process of storing an analog voltage by means of a memory cell which is clocked by a clock signal of high frequency., i.e. which approximates to a limit frequency which is intrinsically defined by the fabrication process used for the implementation of the circuit, can be afflicted with such phenomena.

The invention therefore also relates to a memory cell having a data input, a data output and a clock input which receives a signal referred to as a clock signal, characterized in that it comprises N flip-flops, referred to as memory flip-flops, a multiplexer, and a logic module, referred to as the control module, each memory flip-flop having a data input, a data output and a clock input, the multiplexer having N data inputs, an output forming the output of the memory cell, and P control inputs, N and P being related in such a manner that $N=2^P$, the control module having N inputs and P outputs, all the data inputs of the memory flip-flops being connected together to the data input of the memory cell, the jth memory flip-flop (where j=0 to N−1) receiving at its clock input the clock signal delayed by j.T/N, where T is the period of the clock signal, the data outputs of the N memory flip-flops being connected to the N data inputs of the multiplexer, whose P control inputs are connected to the P outputs of the control module, which control module has each of the N inputs connected to one of the clock inputs of the N flip-flops and has its P outputs arranged in such a manner that the multiplexer supplies the output signal of the jth memory flip-flop at its output during each (j+1)th fraction of a period of the length T/N.

In such a memory cell N digital representations of the signal received on the data input of the memory cells are latched in the same period of the clock signal. The frequency of the clock signal which clocks each of the memory flip-flops which form part of such a memory cell is therefore N times as small as the sampling frequency Fe, which reduces to exp (1–N.Fl/Fe) the probability that an error due to metastability phenomena occurs.

In an embodiment of the invention, a memory cell of the type described above is characterized in that its memory flip-flops are D flip-flops.

As set forth hereinbefore, it may be advantageous to arrange a plurality of D flip-flops in series within one memory flip-flop in order to increase the gain provided by this memory flip-flop.

An advantageous embodiment of the invention therefore provides a memory cell which is characterized in that its memory flip-flops are flip-flops of the master-slave type.

A special embodiment of the invention provides a memory cell having a data input, an output and a clock input, which is characterized in that it comprises two flip-flops, referred to as memory flip-flops, and a multiplexer, each memory flip-flop having a data input, a data output and a clock input, the multiplexer having two data inputs and one control input, the data inputs of the two memory flip-flops being connected to one another and forming the data input of the memory cell, one of the memory flip-flops receiving the clock signal at its clock input and the other one receiving the inverse of said signal at its clock input, the data outputs of the two memory flip-flops being connected to the data inputs of the multiplexer, whose control input receives the clock signal and whose output forms the output of the memory cell.

BRIEF DESCRIPTION OF THE DRAWINGS

The invention will be more fully understood with the aid of the following description of some embodiments, given by way of non-limitative examples, with reference to the accompanying drawings, in which.

DESCRIPTION OF THE PREFERRED EMBODIMENTS

Figure 1:
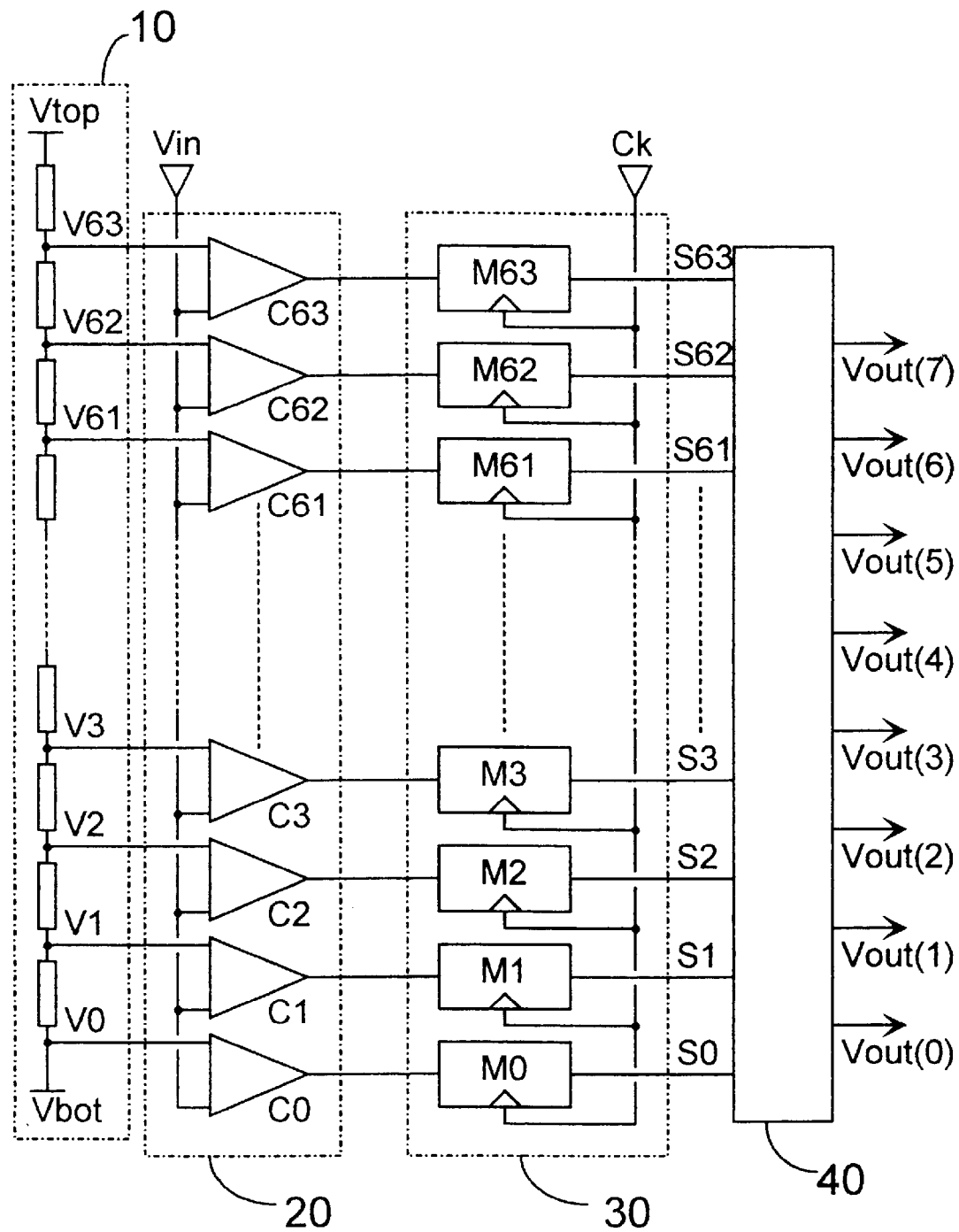
FIG. 1 is a functional diagram showing part of a parallel analog-to-digital converter in accordance with the invention.

FIG. 1 shows a part of a parallel analog-to-digital converter. In the case described here, this converter receives an analog input voltage Vin to be converted into an 8-bit digital output signal Vout(0 . . . 7). This converter comprises:

a resistance ladder 10 comprising 64 resistors arranged in series between a positive supply terminal Vtop and a negative supply terminal Vbot, which resistors produce reference voltages V0, V1, . . . V63 on the nodes between them, V0 being equal to Vbot, a comparator stage 20 comprising 64 comparators, each comparing the analog input voltage Vin with one of the reference voltages V0, V1, . . . V63, a memory stage 30 comprising memory elements referred to as memory cells M0, M1, . . . M63, each memory cell Mi (where i=0 to 63) having a data input, an output and a clock input, and receiving the output signal Ci of a comparator at its data input, all the memory cells M0, M1, . . . M63 forming the memory stage 30 receiving a similar signal Ck, referred to as the clock signal, at their clock inputs, a binary encoder 40, which encoder 40 receives the outputs S0, S1, . . . S63 of the memory stage 30 at its input and supplies the digital output signal Vout(0 . . . 7) of the converter.

Figure 2:
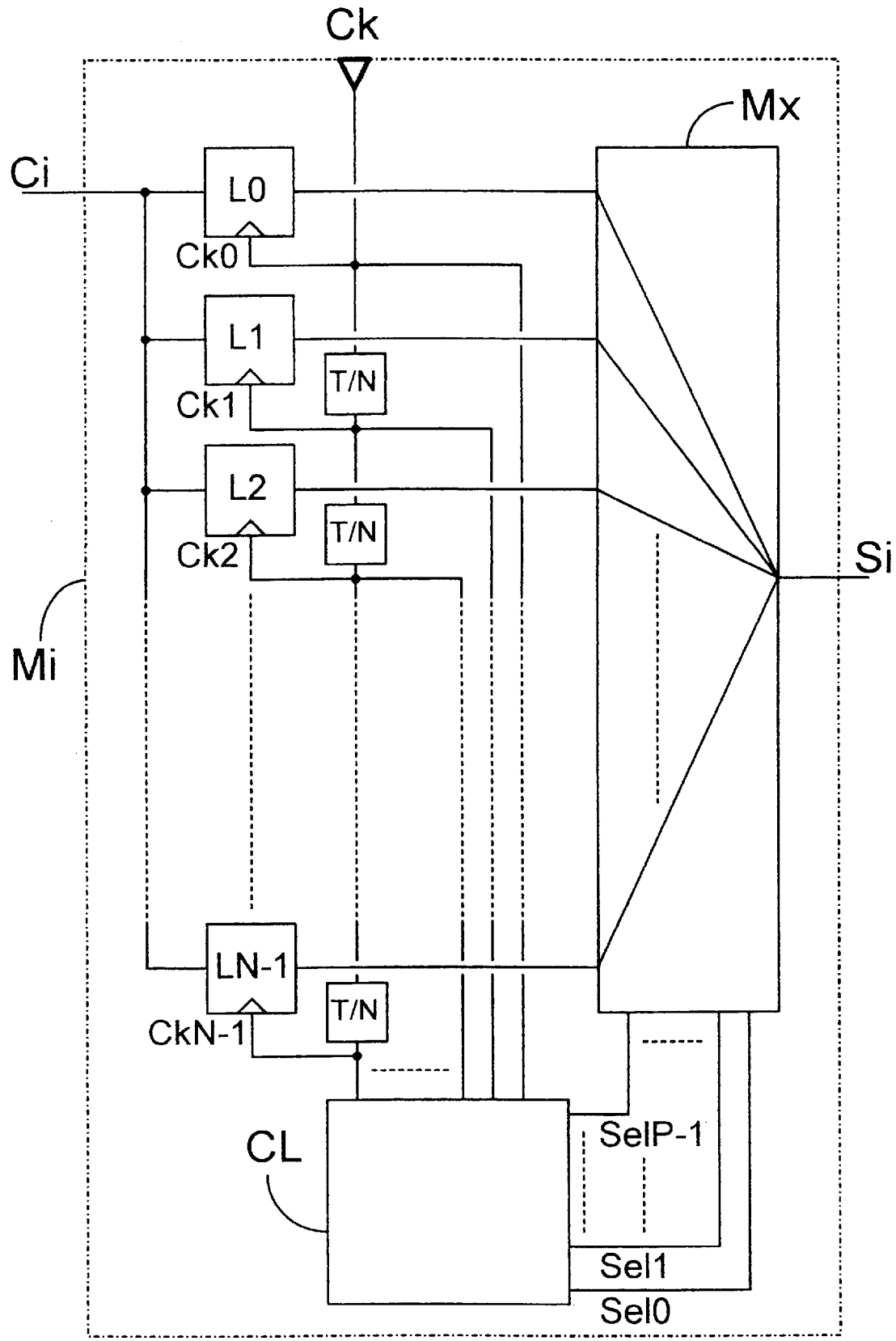
FIG. 2 is a functional diagram of a memory cell included in a parallel analog-to-digital converter in accordance with the invention.

FIG. 2 shows diagrammatically one of the 64 memory cells of the memory stage 30 of a parallel analog-to-digital converter in accordance with the invention. This memory cell Mi (where i=0 to 63) comprises N flip-flops called memory flip-flops L0, L1, . . . LN−1, a multiplexer Mx, and a logic module CL, called control module. Each memory flip-flop L0, L1, . . . LN−1 has a data input, a data output and a clock input. The multiplexer Mx has N data inputs, one output forming the output of the memory cell, and P control inputs, N and P being related in such a manner that $N=2^P$. The control module CL has N inputs and P outputs. All the data inputs of the memory flip-flops L0, L1, . . . LN−1 are connected together to the data input of the memory cell Mi. The jth memory flip-flop (where j=0 to N−1) receives at its clock input the clock signal which has been delayed by means of a delay cell having a delay of j.T/N, where T is the period of the clock signal. The data outputs of the N memory flip-flops L0, L1, . . . LN−1 are connected to the N data inputs of the multiplexer Mx, whose P control inputs are connected to the P outputs of the control module CL. Each of the N inputs of the control module CL is connected to one of the clock inputs Ck0, Ck1, . . . CkN−1 of the N memory flip-flops. The P outputs Sel0, Sel1, . . . SelP−1 of the control module CL are arranged in such a manner that the multiplexer Mx supplies the output signal of the jth memory flip-flop Lj at its output during each (j+1)th fraction of the period of the length T/N.

Figure 3:
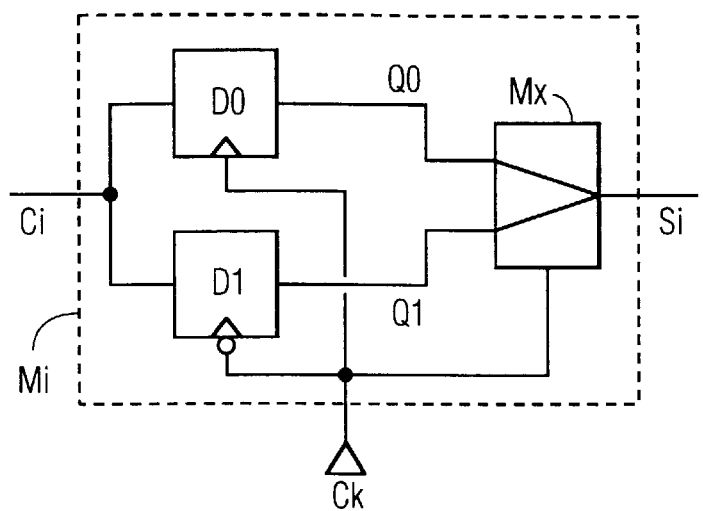
FIG. 3 is a functional diagram of a memory cell included in a parallel analog-to-digital converter in accordance with a special embodiment of the invention, FIG. 4 gives a number of timing diagrams showing signal waveforms appearing in such a memory cell.
Figure 4A:
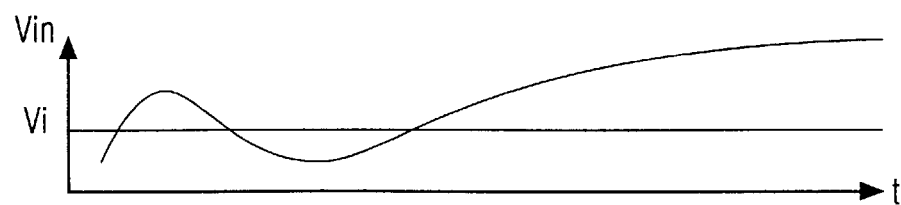
Figure 4B:
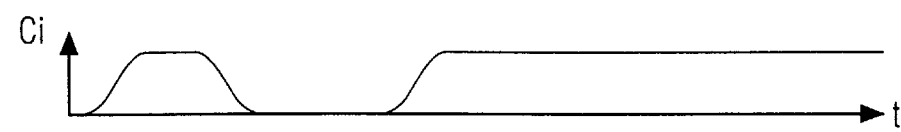
Figure 4C:
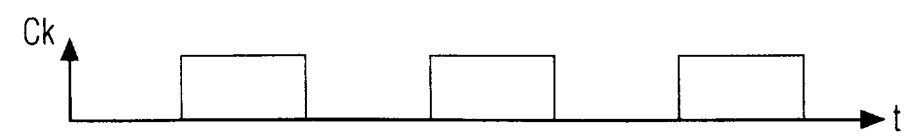
Figure 4D:
Figure 4E:
Figure 4F:
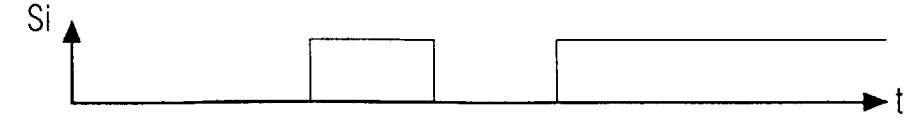

FIG. 3 shows diagrammatically an arbitrary one of the 64 memory cells of the memory stage 30 of a parallel analog-to-digital converter in accordance with a special embodiment of the invention. This memory cell Mi (where i=0 to 63) comprises two D flip-flops D0 and D1, called memory flip-flops, and a multiplexer Mx. Each memory flip-flop D0, D1 has a data input, an output and a clock input. The multiplexer Mx has two data inputs and one control input. The data inputs of the two memory flip-flops D0 and D1 are connected to one another and form the data input of the memory cell. One of the memory flip-flops, D0, receives the clock signal Ck at its clock input and the other one, D1, receives the inverse of said signal Ck at its clock input. The data outputs of the two memory flip-flops D0 and D1 are connected to the data inputs of the multiplexer Mx, whose control input receives the clock signal Ck and whose output forms the output of the memory cell Mi.

FIG. 4 gives a number of timing diagrams which show the signal waveforms appearing in such a memory cell Mi. When the analog input voltage Vin is smaller than the ith reference voltage Vi, the output of the ith comparator supplies a quasi-zero analog output voltage Ci. When the analog input voltage Vin becomes higher than Vi, the voltage Vi rises rapidly but not instantaneously to a non-zero voltage close to the supply voltage of the circuit. The voltage Ci keeps this value until the analog input voltage Vin becomes smaller than the reference voltage Vi. The analog voltage Ci then decreases rapidly but not instantaneously to a quasi-zero voltage. The voltage Ci keeps this value until the analog input voltage Vi again becomes higher than the reference voltage Vi. The voltage Ci then again rises rapidly but not instantaneously to a non-zero voltage close to the supply voltage of the circuit and keeps this value while the analog input voltage Vin remains higher than the reference voltage Vi. In the situation shown in the Figure the D flip-flop D0 does not detect the fluctuation of the analog output voltage Ci of the comparator. Its output voltage Q0 changes over to the high level during the first rising edge of the clock signal Ck. During the second rising edge of the clock signal Ck the voltage Ci has a transition before it resumes a non-zero value. Nevertheless, the clock signal Ck, which clocks the D memory flip-flops D0 and D1 and which has a frequency which is twice as low as the sampling frequency, ensures that the memory flip-flops have a higher immunity to metastability phenomena. The output signal Q0 of the memory flip-flop D0 thus remains high. The D flip-flop D1, on the contrary, does not detect the first time that the analog input voltage Vin exceeds the reference voltage Vi, but the quasi-zero state of voltage Ci during the first falling edge of the clock signal Ck causes output signal Q1 to remain low until the second rising edge of the clock signal Ck, during which the non-zero value of the voltage Ci causes output signal Q1 of the D flip-flop D1 to go high. When the clock signal Ck is low, the output signal S1 of the multiplexer is formed by the output signal Q0 of the D flip-flop D0, and when the clock signal Ck is high the output signal Si of the multiplexer is formed by the output signal Q1 of the D flip-flop D1. The output signal Si of the memory cell Mi thus allows for the fluctuation of the analog output voltage Ci of the comparator and, consequently, also for the fluctuation of the analog input voltage Vin.

Figure 5:
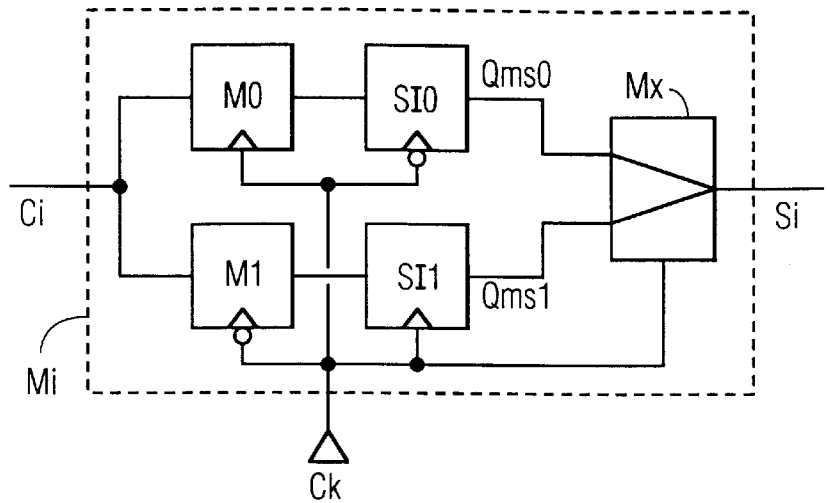
FIG. 5 is a functional diagram of a memory cell included in a parallel analog-to-digital converter in accordance with an advantageous embodiment of the invention, FIG. 6 gives a number of timing diagrams showing signal waveforms appearing in such a memory cell.
Figure 6A:
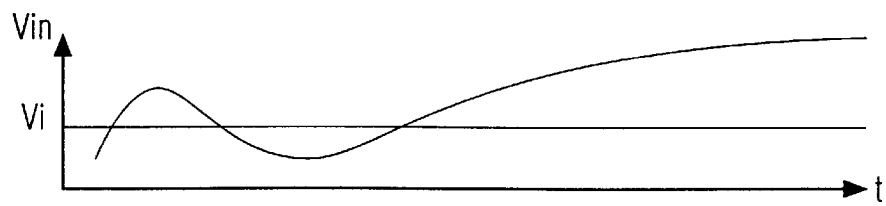
Figure 6B:
Figure 6C:
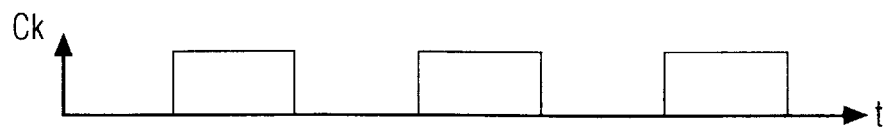
Figure 6D:
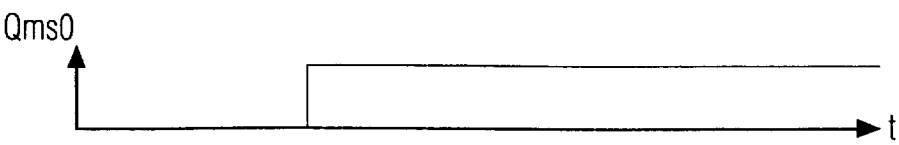
Figure 6E:
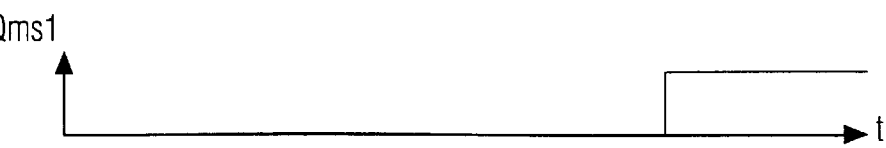
Figure 6F:
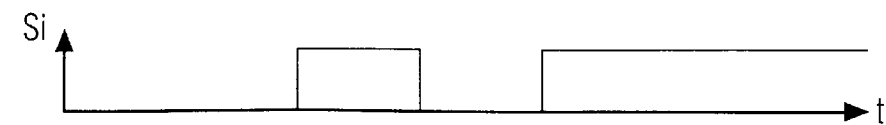

FIG. 5 shows diagrammatically one of the 64 memory cells of the memory stage 30 of a parallel analog-to-digital converter in accordance with an advantageous embodiment of the invention. This memory cell Mi (where i=0 to 63) comprises two flip-flops of the master-slave type, each comprising two D flip-flops M0, S10, and M1, S11, and a multiplexer Mx. Each D flip-flop M0, S10, M1, S11 has a data input, a data output and a clock input. The multiplexer Mx has two data inputs and one control input. The data inputs of the two D flip-flops M0 and M1 are connected to one another and form the data input of the memory cell. The D flip-flop M0 receives the clock signal Ck at its clock input, the D flip-flop S10 receives the inverse of this signal Ck at its clock input, and the data output of the D flip-flop M0 is connected to the data input of the D flip-flop S10. The D flip-flop M1 receives the inverted clock signal Ck at its clock input, the D flip-flop S11 receives the clock signal Ck at its clock input, and the data output of the D flip-flop M1 is connected to the data input of the D flip-flop S11. The data outputs of the two D flip-flops S10 and S11 supply respective signals Qms0 and Qms1 and are connected to respective data inputs of the multiplexer Mx, whose control input receives the clock signal Ck and whose output forms the output of the memory cell Mi.

FIG. 6 gives a number of timing diagrams which show the signal waveforms appearing in such a memory cell Mi. The waveforms of the analog input voltage Vi, of the analog output voltage Ci of the comparator, and of the clock signal Ck are identical to those shown in FIG. 4. The output signals Qms0 and Qms1 of the D flip-flops S10 and S11 consequently vary in the same way as the output signals Q0 and Q1 in FIG. 4, but shifted in time by half a period of the clock signal Ck. When the clock signal Ck is low, the output signal Si of the multiplexer is formed by the output signal Qms0 of the D flip-flop S10 and, when the clock signal Ck is high, the output signal Si of the multiplexer is formed by the output signal Qms1 of the D flip-flop S11. The output signal Si of the memory cell Mi thus allows for the fluctuation of the analog output voltage Ci of the comparator and, consequently, also for the fluctuation of the analog input voltage Vin. The clock signal Ck, which clocks the memory flip-flops M0, S10 and M1, S11 thus has a frequency which is twice as low as the sampling frequency.

Figure 7:
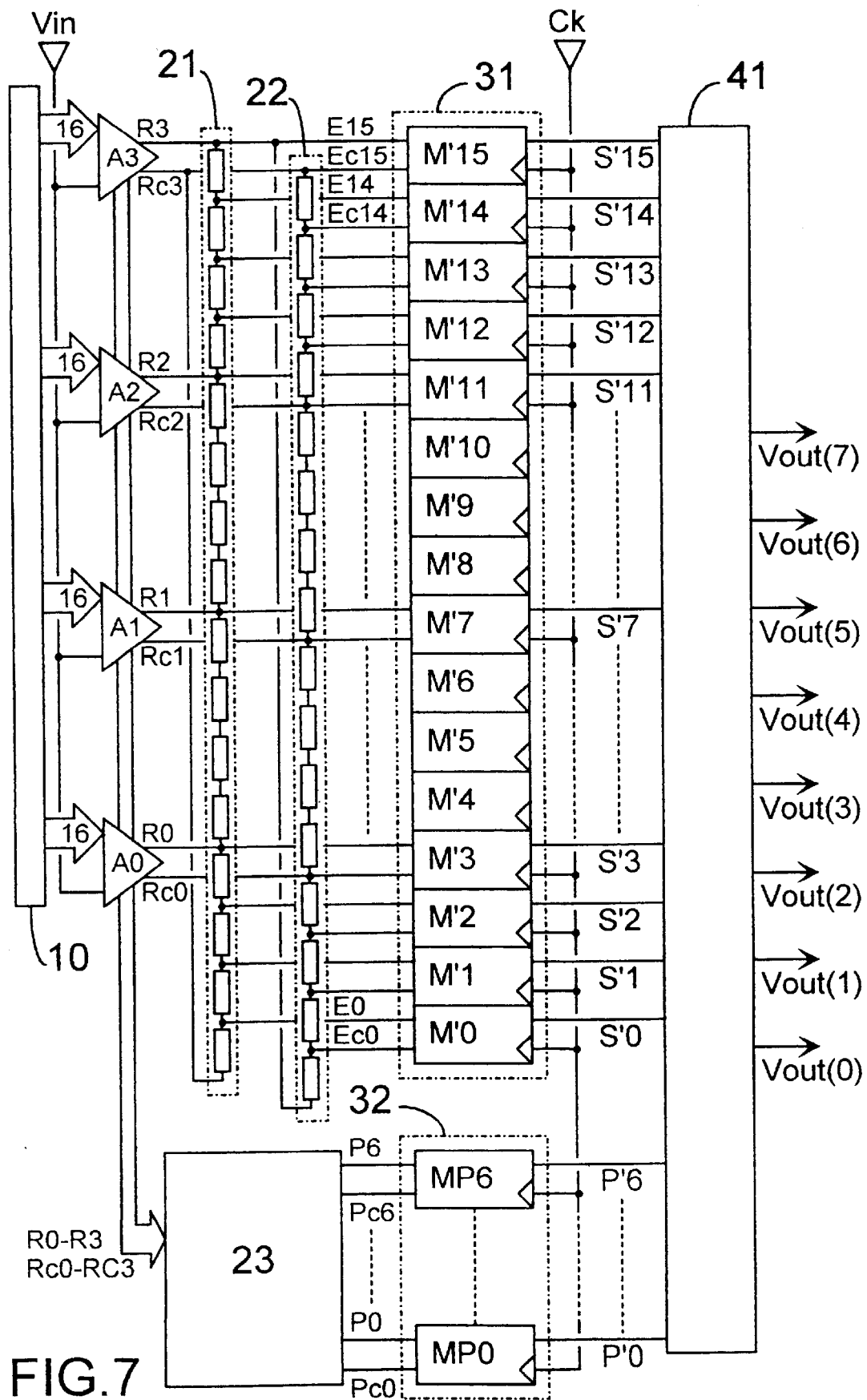
FIG. 7 is a functional diagram showing part of an analog-to-digital converter using folding and interpolation techniques in accordance with the invention.

FIG. 7 shows a part of an analog-to-digital converter using folding and interpolation techniques in accordance with the invention. In the case described here, this converter receives an analog input voltage Vin to be converted into an 8-bit digitally coded output signal Vout(0 . . . 7). This converter comprises:

a resistance ladder 10 comprising 64 resistors arranged in series between a positive supply terminal Vtop and a negative supply terminal Vbot, which resistors produce reference voltages V0, V1, . . . V63 on the nodes between them, V0 being equal to Vbot, folding stages A0, A1, A2, A3, each comprising an array of comparators adapted to generate a folding signal R1, R2, R3, R4, respectively, which varies as a quasi-sinusoidal function of the analog input voltage, and a signal Rc1, Rc2, Rc3, Rc4, respectively, which is the counterpart of this folding signal, two interpolation stages 21 and 22, the first one receiving the folding signals R1, R2, R3, R4 and the second one receiving their counterparts Rc1, Rc2, Rc3, Rc4, each interpolation stage 21, 22 being made up of 16 impedance elements, preferably resistors of equal value, arranged as a divider bridge in such a manner that the signals E0 . . . E15, referred to as sampling signals and generated across the elements of the first interpolation stage 21, represent fractions of the folding signals, the second interpolation stage 22 generating signals Ec0 . . . Ec15 forming their counterparts, a cycle detector 23 which receives the folding signals R1, R2, R3, R4 and their counterparts Rc1, Rc2, Rc3, Rc4 and supplying cycle pointer signals P0 . . . P6 and signals Pc0 . . . Pc6 forming the counterparts of these signals, enabling identification of that one of the cycles of the sampling signals E0 . . . E15 which is significative of the value of the analog input voltage Vin, a first memory stage 31 comprising memory elements referred to as memory cells M'0 . . . M'15, each memory cell M'i (where i=0 to 15) having two data inputs, an output and a clock input, and receiving a sampling signal Ei and its counterpart Eci at its data inputs, all the memory cells M'0 . . . M'15 forming the first memory stage 31 receiving a similar signal Ck, referred to as the clock signal, at their clock inputs, a second memory stage 32 comprising memory cells MP0 . . . MP6, each memory cell MPj (where j=0 to 6) receiving a cycle pointer signal Pj and its counterpart Pcj at its data inputs, all the memory cells MP0 . . . MP6 forming the second memory stage 32 receiving the clock signal Ck at their clock inputs, a binary encoder 41 which receives the outputs of the memory stages at its input and supplies the digital output signal Vout(0 . . . 7) of the converter.

Figure 8:
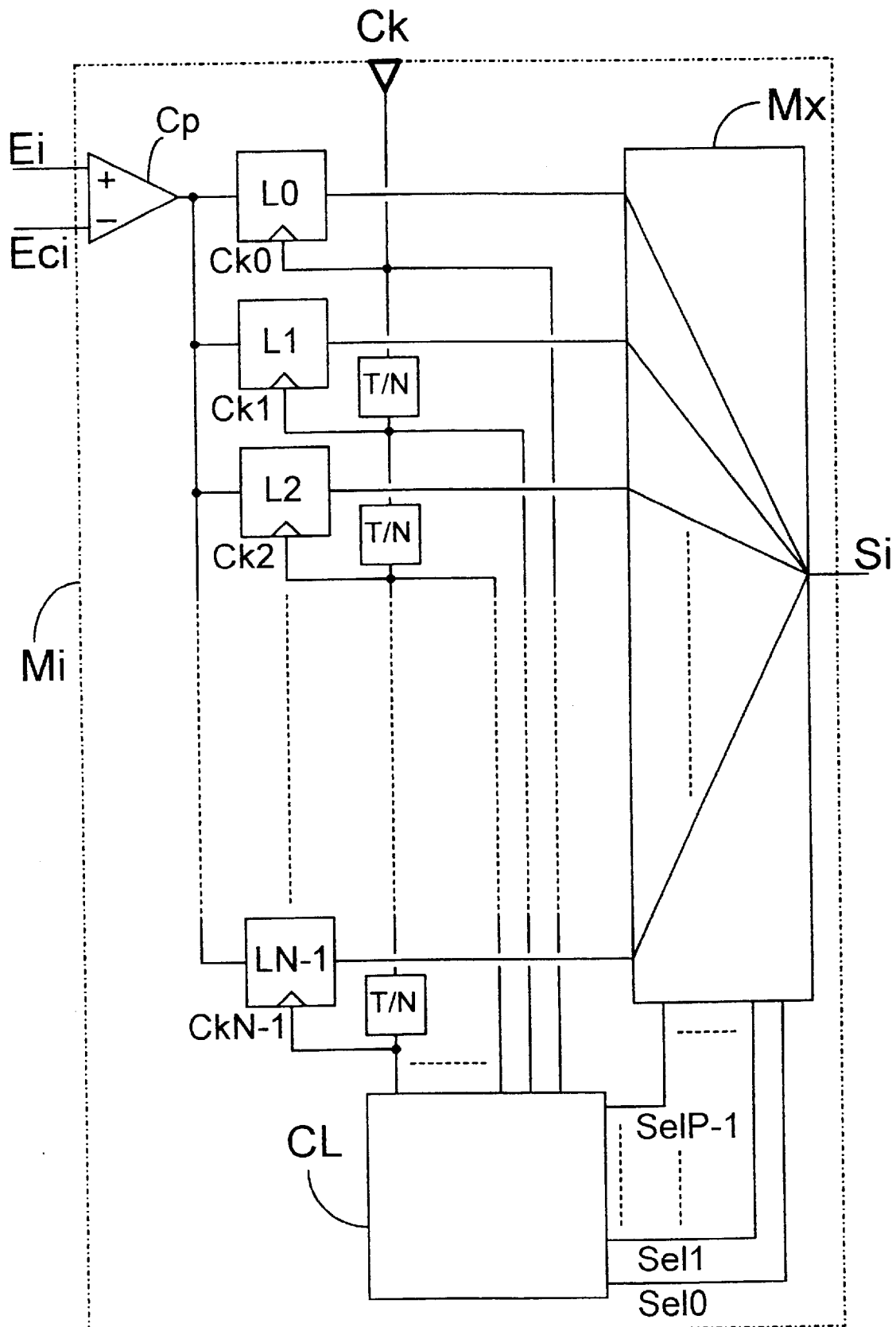
FIG. 8 is a functional diagram of a memory cell included in an analog-to-digital converter using folding and interpolation techniques in accordance with the invention.

FIG. 8 shows diagrammatically one of the sixteen memory cells M'0 . . . M'15 of the memory stage 31 of an analog-to-digital converter using folding and interpolation techniques in accordance with the invention. The seven memory cells MP0 . . . MP6 forming the second memory stage 32 also have the same structure. This memory cell M'i (where i=0 to 15) comprises a comparator Cp, N memory flip-flops L0, L1, . . . LN−1, a multiplexer Mx, and a logic module CL referred to as the control module. Each memory flip-flop L0, L1, . . . LN−1 has a data input, a data output and a clock input. The multiplexer Mx has N data inputs, one output forming the output of the memory cell, and P control inputs, N and P being related in such a manner that $N=2^P$. The control module CL has N inputs and P outputs. The inputs of the comparator Cp are connected to the data inputs of the memory cell. All the data inputs of the memory flip-flops L0, L1, . . . LN−1 are connected together to the output of the comparator Cp. The jth memory flip-flop (where j=0 to N−1) receives at its clock input the clock signal which has been delayed by means of a delay cell having a delay of j.T/N, where T is the period of the clock signal. The data outputs of the N memory flip-flops L0, L1, . . . LN−1 are connected to the N data inputs of the multiplexer Mx, whose P control inputs are connected to the P outputs of the control module CL. Each of the N inputs of the control module CL is connected to one of the clock inputs Ck0, Ck1, . . . CkN−1 of the N memory flip-flops. The P outputs Sel0, Sel1, . . . SelP−1 of the control module CL are arranged in such a manner that the multiplexer Mx supplies the output signal of the jth memory flip-flop Lj at its output during each (j+1)th fraction of the period of the length T/N.

Figure 9:
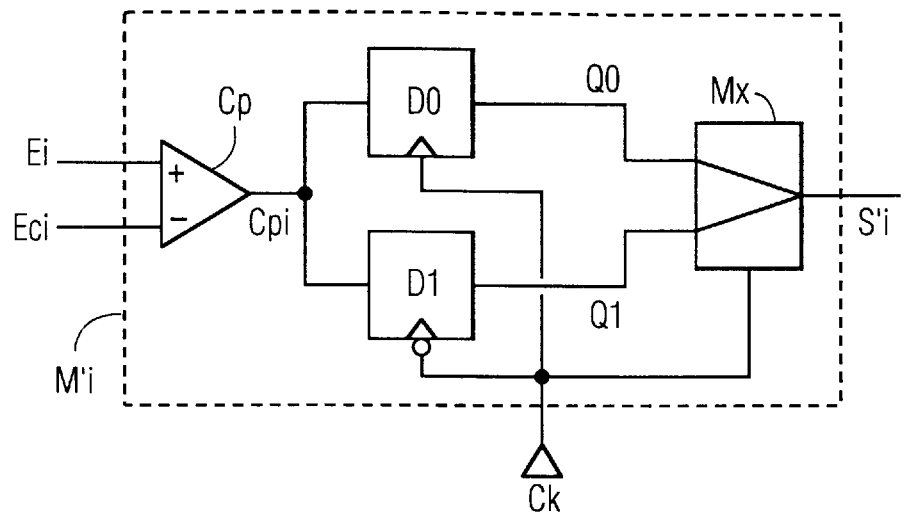
FIG. 9 is a functional diagram of a memory cell included in an analog-to-digital converter using folding and interpolation techniques in accordance with a special embodiment of the invention, FIG. 10 gives a number of timing diagrams showing signal waveforms appearing in such a memory cell.
Figure 10A:
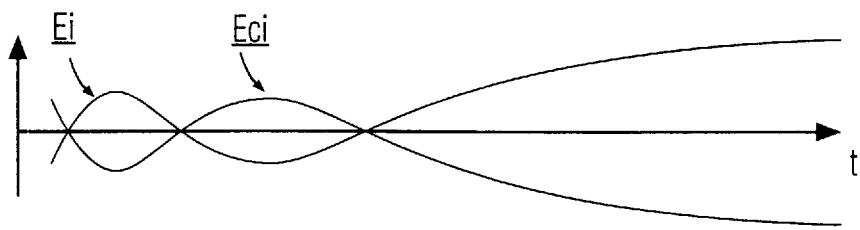
Figure 10B:
Figure 10C:
Figure 10D:
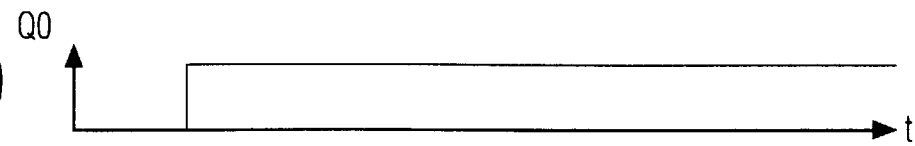
Figure 10E:
Figure 10F:
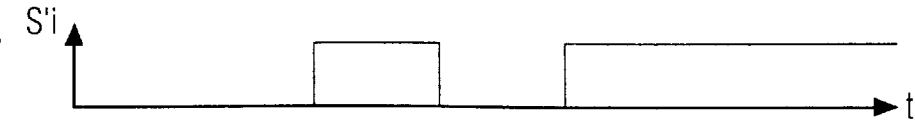

FIG. 9 shows diagrammatically one of the sixteen memory cells M'0 . . . M'15 of the memory stage 31 of an analog-to-digital converter using folding and interpolation techniques in accordance with a special embodiment of the invention. The seven memory cells MP0 . . . MP6 forming the second memory stage 32 also have the same structure. This memory cell M'i (where i=0 to 15) comprises a comparator Cp, two D flip-flops D0 and D1, called memory flip-flops, and a multiplexer Mx. Each memory flip-flop D0, D1 has a data input, a data output and a clock input. The multiplexer Mx has two data inputs and one control input. The inputs of the comparator Cp are connected to the data inputs of the memory cell. The data inputs of the two memory flip-flops D0 and D1 are connected together to the output of the comparator. One of the memory flip-flops, D0, receives the clock signal Ck at its clock input, and the other one, D1, receives the inverse of this signal Ck at its clock input. The data outputs of the two memory flip-flops D0 and D1 supply signals Q0 and Q1 and are connected to the data inputs of the multiplexer Mx, whose control input receives the clock signal Ck and whose output forms the output of the memory cell M'i.

FIG. 10 gives a number of timing diagrams which show the signal waveforms appearing in such a memory cell M'i. The waveforms of the sampling signals Ei, Eci applied to its input have been chosen arbitrarily but so as to ensure a certain consistency with the situations illustrated hereinbefore, for a better understanding of the invention. When the sampling signal Ei has a negative value, the output Cpi of the comparator Cp supplies a quasi-zero analog output voltage Cpi. When the sampling signal Ei passes through zero and assumes a positive value, the voltage Cpi rises rapidly but not instantaneously to a non-zero voltage close to the supply voltage of the circuit. The voltage Cpi keeps this value until the sampling signal Ei again assumes a negative value. The analog voltage Cpi then decreases rapidly but not instantaneously to a quasi-zero voltage. The voltage Cpi keeps this value until the sampling signal Ei goes positive again. The voltage Cpi then rises again rapidly but not instantaneously to a non-zero voltage close to the supply voltage of the circuit and keeps this value while the sampling signal Ei is positive. In the situation shown in the Figure the waveform of the signal Cpi is identical to that of the signal Ci in FIG. 4. The signals Q0 and Q1 therefore vary in the same way and the waveform of the signal S'i is identical to that of the signal Si in FIG. 4. The output signal S'i of the memory cell M'i thus allows for the fluctuation of the analog output voltage Cpi of the comparator and, consequently, also for the fluctuation of the sampling signal Ei. The clock signal Ck, which clocks the D-type memory flip-flops D0 and D1 thus has a frequency which is twice as low as the sampling frequency.

Figure 11:
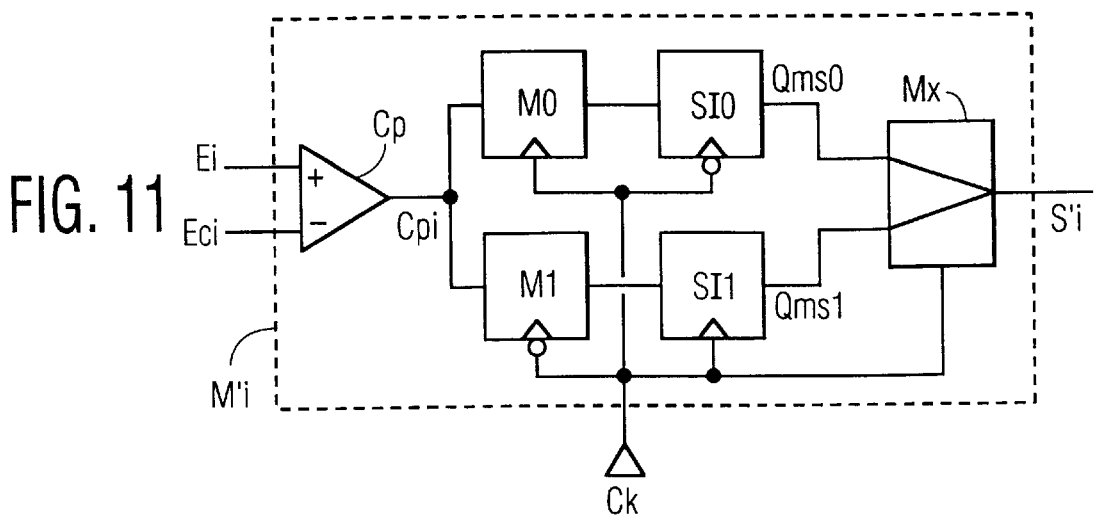
FIG. 11 is a functional diagram of a memory cell included in an analog-to-digital converter using folding and interpolation techniques in accordance with an advantageous embodiment of the invention, and FIG. 12 gives a number of timing diagrams showing signal waveforms appearing in such a memory cell.
Figure 12A:
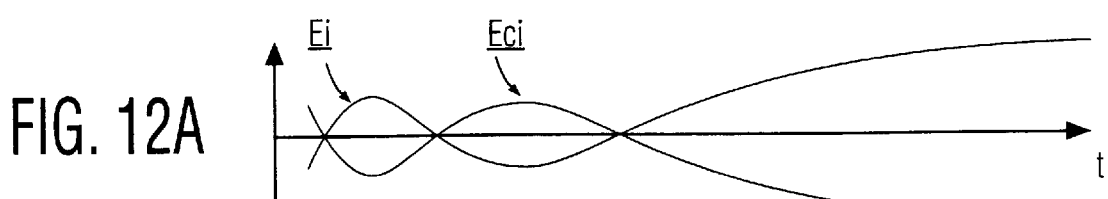
Figure 12B:
Figure 12C:
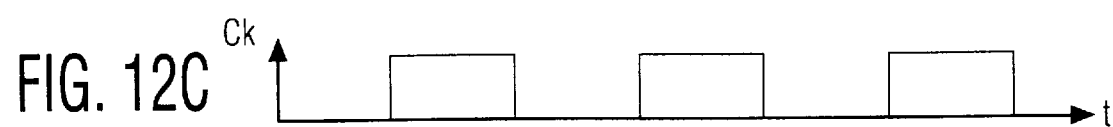
Figure 12D:
Figure 12E:
Figure 12F:
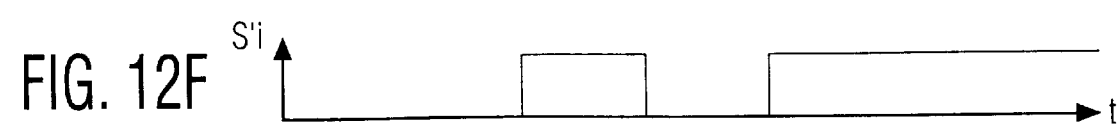

FIG. 11 shows diagrammatically one of the sixteen memory cells M'0 . . . M'15 of the memory stage 31 of an analog-to-digital converter using folding and interpolation techniques in accordance with an advantageous embodiment of the invention. The seven memory cells MP0 . . . MP6 forming the second memory stage 32 also have the same structure. This memory cell M'i (where i=0 to 15) comprises a comparator Cp, two flip-flops of the master-slave type, each comprising two D flip-flops M0, S10 and M1, S11, and a multiplexer Mx. Each D flip-flop M0, S10, M1, S11 has a data input, a data output and a clock input. The multiplexer Mx has two data inputs and one control input. The inputs of the comparator are connected to the data inputs of the memory cell. The data inputs of the two D flip-flops M0 and M1 are connected together to the output of the comparator Cp. The D flip-flop M0 receives the clock signal Ck at its clock input, the D flip-flop S10 receives the inverse of this signal Ck at its clock input, and the data output of the D flip-flop M0 is connected to the data input of the D flip-flop S10. The D flip-flop M1 receives the inverse of the clock signal Ck at its clock input, the D flip-flop S11 receives the signal CK at its clock input, and the data output of the D flip-flop M1 is connected to the data input of the D flip-flop S11. The data outputs of the two D flip-flops S10 and S11 supply the signals Qms0 and Qms1 and are connected to the data inputs of the multiplexer Mx, whose control input receives the clock signal Ck and whose output forms the output of the memory cell M'i.

FIG. 12 gives a number of timing diagrams which show the signal waveforms appearing in such a memory cell M'i. The waveforms of the sampling signal Ei, of the analog output voltage Cpi of the comparator, and of the clock signal Ck are identical to those shown in FIG. 10. The output signals Qms0 and Qms1 of the D flip-flops S10 and S11 consequently vary in the same way as the output signals Q0 and Q1 in FIG. 10, but shifted in time by half a period of the clock signal Ck. When the clock signal Ck is low, the output signal Si of the multiplexer is formed by the output signal Qms0 of the D flip-flop S10 and, when the clock signal Ck is high, the output signal Si of the multiplexer is formed by the output signal Qms1 of the D flip-flop S11. The output signal Si of the memory cell Mi thus allows for the fluctuation of the analog output voltage Cpi of the comparator and, consequently, also for the fluctuation of the sampling signal Ei. The clock signal Ck, which clocks the memory flip-flops M0, S10 and M1, SL1 thus has a frequency which is twice as low as the sampling frequency.

We claim:

1. An analog-to-digital converter receiving an analog input voltage to be converted into a digital output signal, comprising:

a ladder network of resistors in series between a positive supply terminal and a negative supply terminal, which resistors produce a plurality of reference voltages on the nodes between them, a stage of comparators, each comparing the analog input voltage with a respective one of the reference voltages, a memory stage comprising memory cells, each memory cell having a data input, a data output and a clock input, and receiving the output signal of a respective comparator at its data input, all of the memory cells receiving a clock signal at their clock inputs, a binary encoder which receives the outputs of the memory stage at its input and supplies the digital output signal of the converter, characterized in that each memory cell comprises:

N memory flip-flops,
a multiplexer, and,
a control module, each memory flip-flop having a data input, a data output and a clock input, the multiplexer having N data inputs, one output forming the output of the memory cell, and P control inputs, N and P being related such that $N=2^P$, the control module having N inputs and P outputs, all of the data inputs of the memory flip-flops being connected together to the data input of the memory cell, the jth memory flip-flop (where j=0 to N−1) receiving at its clock input the clock signal delayed by $j*T/N$, where T is the period of the clock signal, the data outputs of the N memory flip-flops being connected to the N data inputs of the multiplexer, the multiplexer's P control inputs are connected to the P outputs of the control module, and the control module has each of its N inputs connected to a respective one of the clock inputs of the N flip-flops and has its P outputs arranged such that the multiplexer supplies the output signal of the jth memory flip-flop at its output during each (j+1)th fraction of a period of the length T/N.

2. An analog-to-digital converter as claimed in claim 1, wherein the memory flip-flops in the memory cells of the memory stage are D flip-flops.

3. An analog-to-digital converter as claimed in claim 1, wherein the memory flip-flops in the memory cells of the memory stage are flip-flops of the master-slave type.

4. An analog-to-digital converter as claimed in claim 1 wherein each memory cell comprises only two memory flip-flops, and a multiplexer, each memory flip-flop having a data input, a data output and a clock input, the multiplexer having two data inputs and one control input, the data inputs of the two memory flip-flops being connected to one another and forming the data input of the memory cell, one of the memory flip-flops receiving the clock signal at its clock input and the other memory flip-flop receiving the inverse of said clock signal at its clock input, the data outputs of the two memory flip-flops being connected to respective data inputs of the multiplexer, whose control input receives the clock signal and whose output forms the output of the memory cell.

5. An analog-to-digital converter receiving an analog input voltage to be converted into a digital output signal, comprising:

a ladder network of resistors arranged in series between a positive supply terminal and a negative supply terminal, which resistors produce a plurality of reference voltages on the nodes between them, a stage of comparators, each comparing the analog input voltage with a respective one of the reference voltages, a memory stage comprising memory cells, each memory cell having a data input, a data output and a clock input, and receiving the output signal of a respective comparator at its data input, all of the memory cells receiving a clock signal at their clock inputs, a binary encoder which receives the outputs of the memory stage at its input and supplies the digital output signal of the converter, characterized in that each memory cell comprises two memory flip-flops, and a multiplexer, each memory flip-flop having a data input, a data output and a clock input, the multiplexer having two data inputs and one control input, the data inputs of the two memory flip-flops being connected to one another and forming the data input of the memory cell, one of the memory flip-flops receiving the clock signal at its clock input and the other memory flip-flop receiving the inverse of said clock signal at its clock input, the data outputs of the two memory flip-flops being connected to respective data inputs of the multiplexer, whose control input receives the clock signal and whose output forms the output of the memory cell.

6. An analog-to-digital converter as claimed in claim 5, wherein the memory flip-flops in the memory cells of the memory stage are D flip-flops.

7. An analog-to-digital converter as claimed in claim 5, wherein the memory flip-flops in the memory cells of the memory stage are flip-flops of the master-slave type.

8. An analog-to-digital converter receiving an analog input voltage to be converted into a digital output signal, comprising:
   a ladder network of resistors arranged in series between a positive supply terminal and a negative supply terminal, which resistors produce a plurality of reference voltages on the nodes between them,
   a plurality of folding stages, each comprising an array of comparators adapted to generate a folding signal which varies as a quasi-sinusoidal function of the analog input voltage, and a signal which is the counterpart of said folding signal,
   a first and a second interpolation stage, the first one receiving the folding signals and the second one receiving their counterparts, each interpolation stage being made up of impedance elements, preferably resistors of equal value, arranged as a divider bridge such that the sampling signals generated across the elements of the first interpolation represent fractions of the folding signals, the signals generated by the second interpolation stage forming their counterparts,
   a cycle detector which receives the folding signals and their counterparts and supplies cycle pointer signals and signals forming the counterparts thereof, enabling identification of that one of the cycles of the sampling signals which is significative of the value of the analog input voltage,
   a first memory stage comprising memory cells, each memory cell having two data inputs, a data output and a clock input, and receiving at its data inputs a sampling signal and its counterpart, all of the memory cells forming the first memory stage receiving a clock signal at their clock inputs,
   a second memory stage comprising memory cells, each memory cell receiving at its data inputs a cycle pointer signal and its counterpart, all of the memory cells forming the second memory stage receiving the clock signal at their clock inputs,
   a binary encoder which receives the outputs of the memory stages at its input and supplies the digital output signal of the converter,
   characterized in that the memory cells of the memory stages each comprise:
   N memory flip-flops,
   a multiplexer, and,
   a control module,
   each memory flip-flop having a data input, a data output and a clock input,
   the multiplexer having N data inputs and P control inputs and one output forming the output of the memory cell, N and P being related in such a manner that $N=2^P$,
   the memory module having N inputs and P outputs,
   all of the data inputs of the memory flip-flops being connected together to the output of the input comparator of the memory cell, the jth memory flip-flop (where j=0 to N−1) receiving at its clock input the clock signal delayed by j*T/N, where T is the period of the clock signal,
   the data outputs of the N memory flip-flops being connected to the N data inputs of the multiplexer,
   the multiplexer's P control inputs are connected to the P outputs of the control module,
   each of the N inputs of the control module being connected to one of the clock inputs of the N memory flip-flops, and,
   the P outputs of said control module being arranged such that the multiplexer supplies the output signal of the jth memory flip-flop at its output during each (j+1)th fraction of a period of the length T/N.

9. An analog-to-digital converter as claimed in claim 8, wherein the memory flip-flops in the memory cells of the memory stage are D flip-flops.

10. An analog-to-digital converter as claimed in claim 8, wherein the memory flip-flops in the memory cells of the memory stage are flip-flops of the master-slave type.

11. An analog-to-digital converter as claimed in claim 8, wherein N is equal to two, and P is equal to one.

12. An analog-to-digital converter as claimed in claim 11, wherein the memory flip-flops in the memory cells of the memory stage are D flip-flops.

13. An analog-to-digital converter as claimed in claim 11, wherein the memory flip-flops in the memory cells of the memory stage are flip-flops of the master-slave type.

14. An analog-to-digital converter as claimed in claim 8 wherein each memory cell comprises only two memory flip-flops, and a multiplexer, each memory flip-flop having a data input, a data output and a clock input, the multiplexer having two data inputs and one control input, the data inputs of the two memory flip-flops being connected to one another and forming the data input of the memory cell, one of the memory flip-flops receiving the clock signal at its clock input and the other memory flip-flop receiving the inverse of said clock signal at its clock input, the data outputs of the two memory flip-flops being connected to respective data inputs of the multiplexer, whose control input receives the clock signal and whose output forms the output of the memory cell.

15. A memory cell having a data input, a data output and a clock input which receives a clock signal,
   characterized in that the memory cell comprises:
   N memory flip-flops,
   a multiplexer, and,
   a control module,
   each memory flip-flop having a data input, a data output and a clock input,
   the multiplexer having N data inputs, an output forming the output of the memory cell, and P control inputs, N and P being related such that $N=2^P$,
   the control module having N inputs and P outputs,
   all of the data inputs of the memory flip-flops being connected together to the data input of the memory cell, the jth memory flip-flop (where j=0 to N−1) receiving at its clock input the clock signal delayed by j*T/N, where T is the period of the clock signal,
   the data outputs of the N memory flip-flops being connected to respective N data inputs of the multiplexer, the multiplexer's P control inputs are connected to the P outputs of the control module, and the control module has its N inputs connected to respective ones of the clock inputs of the N flip-flops and has its P outputs arranged such that the multiplexer supplies the output signal of the jth memory flip-flop at its output during each (j+1)th fraction of a period of the length T/N.

16. A memory cell as claimed in claim 15, wherein its memory flip-flops are D flip-flops.

17. A memory cell as claimed in claim 15, wherein its memory flip-flops are flip-flops of the master-slave type.

18. A memory cell as claimed in claim 15, wherein N is equal to two, and P is equal to one.

19. A memory cell as claimed in claim 18, wherein its memory flip-flops are D flip-flops.

20. A memory cell as claimed in claim 18, wherein its memory flip-flops are flip-flops of the master-slave type.

21. A memory cell as claimed in claim 15 which comprises only two memory flip-flops, and a multiplexer, each memory flip-flop having a data input, a data output and a clock input, the multiplexer having two data inputs and one control input, the data inputs of the two memory flip-flops being connected to one another and forming the data input of the memory cell, one of the memory flip-flops receiving the clock signal at its clock input and the other memory flip-flop receiving the inverse of said clock signal at its clock input, the data outputs of the two memory flip-flops being connected to respective data inputs of the multiplexer, whose control input receives the clock signal and whose output forms the output of the memory cell.

* * * * *